(12) United States Patent
Mevellec et al.

(10) Patent No.: US 9,190,283 B2
(45) Date of Patent: Nov. 17, 2015

(54) METHOD OF DEPOSITING METALLIC LAYERS BASED ON NICKEL OR COBALT ON A SEMICONDUCTING SOLID SUBSTRATE; KIT FOR APPLICATION OF SAID METHOD

(75) Inventors: Vincent Mevellec, Chaville (FR); Dominique Suhr, Chatenay-Malabry (FR)

(73) Assignee: ALCHIMER, Massy (FR)

( * ) Notice: Subject to any disclaimer, the term of this patent is extended or adjusted under 35 U.S.C. 154(b) by 0 days.

(21) Appl. No.: 14/009,485

(22) PCT Filed: Apr. 18, 2012

(86) PCT No.: PCT/EP2012/057085
§ 371 (c)(1),
(2), (4) Date: Dec. 9, 2013

(87) PCT Pub. No.: WO2012/150133
PCT Pub. Date: Nov. 8, 2012

(65) Prior Publication Data
US 2014/0087560 A1 Mar. 27, 2014

(30) Foreign Application Priority Data
May 5, 2011 (FR) ...................................... 11 53843

(51) Int. Cl.
*H01L 21/288* (2006.01)
*C23C 18/32* (2006.01)

(52) U.S. Cl.
CPC ............. *H01L 21/288* (2013.01); *C23C 18/32* (2013.01)

(58) Field of Classification Search
None
See application file for complete search history.

(56) References Cited

U.S. PATENT DOCUMENTS

| 8,119,542 B2 | 2/2012 | Mevellec |
| 8,524,512 B2 | 9/2013 | Mevellec |
| 2005/0110149 A1 | 5/2005 | Osaka et al. |
| 2005/0245080 A1* | 11/2005 | Wang et al. .................... 438/678 |
| 2008/0079154 A1 | 4/2008 | Osaka et al. |
| 2008/0224313 A1 | 9/2008 | Yabe et al. |
| 2010/0003808 A1 | 1/2010 | Mevellec et al. |
| 2012/0156892 A1 | 6/2012 | Mevellec et al. |
| 2012/0196441 A1 | 8/2012 | Mevellec et al. |
| 2012/0260658 A1 | 10/2012 | Bader et al. |

FOREIGN PATENT DOCUMENTS

| EP | 1479793 | 11/2004 | |
| FR | 2933425 | 1/2010 | |
| FR | 2935713 | 3/2010 | |
| FR | 2950063 | 3/2011 | |
| FR | 2950634 | 4/2011 | |
| FR | 2950863 | 4/2011 | |
| JP | 2007-254793 | 10/2007 | |
| WO | WO 2010/001054 | 1/2010 | |
| WO | WO2010/026243 A1 * | 3/2010 | ............. C23C 18/18 |

OTHER PUBLICATIONS

Feng et al.: "Electroless Planting Ni-based Barrier Layers for Silicon Vertical Interconnects"; IEEE 2006 7th International Conference on Electronics Packaging Technology (3 pages).

* cited by examiner

*Primary Examiner* — Michael Jung
(74) *Attorney, Agent, or Firm* — Hamre, Schumann, Mueller & Larson, P.C.

(57) ABSTRACT

The present invention relates to a kit intended for the deposition of nickel or cobalt in the cavities of a semiconductor substrate intended to form through-silicon vias (TSV) for making interconnections in integrated circuits in three dimensions.
The invention also relates to a method of metallization of the insulating surface of such a substrate which comprises contacting the surface with a liquid aqueous solution containing:
  at least one metal salt of nickel or cobalt;
  at least one reducing agent;
  at least one polymer bearing amine functions, and
  at least one agent stabilizing the metal ions.
The step coverage of the layer of nickel or cobalt obtained can be greater than 80%, which facilitates subsequent filling of the vias with copper by electrodeposition.

20 Claims, No Drawings

METHOD OF DEPOSITING METALLIC LAYERS BASED ON NICKEL OR COBALT ON A SEMICONDUCTING SOLID SUBSTRATE; KIT FOR APPLICATION OF SAID METHOD

BACKGROUND OF THE INVENTION

The present invention relates generally to the fabrication of electronic devices, such as integrated circuits in three dimensions. It relates in particular to a kit of compositions and a method of metallization of an insulating substrate having cavities such as through-silicon vias, by electroless deposition of a metallic layer of nickel or cobalt.

To produce integrated circuits in three dimensions (3D), the chips are superposed and connected together by vertical interconnections commonly called through-silicon vias (TSVs) filled with electrically-conducting copper.

The vias are generally etched in the silicon, then metallized to the desired depth before thinning the silicon wafer. During metallization, the vias are therefore closed or "blind" (and are called "blind vias"). The shape and size of the vias vary depending on their function and their position in the silicon wafer. They are generally characterized by their depth, their aperture diameter, and their aspect ratio, defining the ratio of depth to diameter of the via. For example, a cylindrical via of aspect ratio 10:1 has a diameter that is one tenth of its depth. The vias are generally of cylindrical shape, but there are also tapered vias whose opening is wider than the bottom. Structures having through-silicon vias are generally metallized by a process similar to the "damascene process" used in the field of microelectronics for making interconnecting elements, whose dimensions are smaller than those of the through-silicon vias. This process comprises a succession of steps including:

etching the vias in the silicon wafer;
depositing an insulating layer generally consisting of silicon oxide or of an insulating polymer;
depositing a barrier layer or "liner" for preventing migration of the copper;
filling the vias by electrodeposition of copper; and
removing the excess copper from the surface of the silicon wafer by mechanical-chemical polishing of the substrate surface.

Before filling the vias with copper, it may be necessary to deposit a thin layer of metallic copper, called a seed layer, on the barrier layer; this lowers the electrical resistance of the surface of the barrier layer, and promotes uniform filling of the vias with copper.

The steps of depositing the barrier layer, of an optional seed layer, of filling with copper, and of polishing of the copper are commonly designated together with the expression "metallization of through-silicon vias".

The insulating layer generally consists of a derivative of silicon such as silicon oxide or silicon nitride, or of an insulating polymer.

It is necessary to deposit a layer on the insulator, for preventing the migration of copper atoms under the effect of the electric current densities applied during operation of the integrated circuit. This layer, called "barrier to the diffusion of copper" or simply "barrier", generally consists of tantalum (Ta), titanium (Ti), nickel (Ni), cobalt (Co), nickel-tungsten alloy (NiW), cobalt-tungsten alloy (CoW), nickel-boron alloy (NiB), cobalt-boron alloy (CoB), nickel-phosphorus alloy (NiP), cobalt-phosphorus alloy (CoP), tantalum nitride (TaN), titanium nitride (TiN), titanium-tungsten alloy (TiW), tungsten carbon nitride (WCN) or of a combination of these materials.

The barrier layer is generally deposited in the vapor phase (PVD, CVD, ALD) but can also be formed from a metal salt solution, which deposits the metal on the surface of the insulating substrate.

When the substrate is an electrical conductor, electrodeposition of the metal on the surface of the substrate can be effected by polarizing the latter electrically. Electrodeposition is carried out for example by passing a current between the substrate to be coated, constituting a first electrode, and a second electrode placed in a bath containing the metal ions, and optionally various agents for improving the properties of the coating formed, such as the evenness, resistivity and fineness of the deposit.

The deposition of metal on the barrier layer can also be carried out by a non-electrochemical process, also called autocatalytic or "electroless", which does not require electrical polarization of the substrate.

The invention finds application in particular in the deposition of a barrier layer based on nickel or cobalt in the course of a process for metallization of through-silicon vias. The substrate whose surface is to be coated is preferably a conducting or semiconducting substrate coated with an insulating layer having a collection of cavities notably intended to form through-silicon vias, such as those used for the fabrication of integrated circuits in three dimensions. The invention relates more particularly to a method of depositing a barrier layer based on nickel or cobalt, preferably in electroless conditions.

Electroless processes for depositing nickel-based barrier layers have already been described in the prior art.

Thus, patent application US 2005/0110149 describes a method of fabrication of a semiconductor device comprising an insulating intermediate layer based on silica covered with a monomolecular film of organic silane surface-modified with a compound containing palladium, the film thus modified being covered by an electroless process with a cobalt-based or nickel-based layer forming a barrier, on which a layer of copper can be deposited by electrodeposition.

A substantially similar method is described in patent application US 2008/0079154, which recommends, for improving the properties of adhesion between the different layers of the semiconductor device, carrying out two consecutive electroless treatments with a nickel-based compound (NiB), and then with a cobalt-based compound (CoWP).

Furthermore, repair of barrier layers based on titanium by electroless deposition of a thin layer of nickel and of boron has been suggested (FR 2 935713-A1).

Polyethylene-imines have already been used in electrodeposition solutions as copper complexing agents, notably for repairing copper seed layers, previously deposited on a barrier layer to copper diffusion (EP 1 479 793).

In document JP 2007-254 793, poly(allyl-amines) are proposed as nickel stabilizer in electroless processes, to prevent precipitation of reaction by-products on the nickel deposit.

The methods for deposition of barrier layers in the prior art, whether they are performed in the vapor phase, electrochemically or by an autocatalytic electroless reaction, make it possible to obtain a conformable barrier layer, i.e. matching, without discontinuity, the surface topography of the vias to be coated, and moreover for a wide range of aspect ratios. However, the bottom of the cavities is always less accessible to the deposition of material than the walls of the vias and the substrate surface, so that the thickness of the metallic barrier layer deposited at the bottom of the vias is always less than the thickness of the layer at the other levels of the deposit, whether on the walls of the via, at the opening of the via or on the substrate surface.

The nonuniform distribution of the deposit of the barrier layer on the surface of the cavities has essentially two drawbacks. Firstly, it makes subsequent filling of the vias with copper by electrodeposition more difficult. In fact, with smaller thickness of the metallic barrier layer, electrodeposition of copper on its surface in a subsequent step is more difficult, because of the lower current densities in the barrier layer resulting from the polarization of the substrate during the step of filling the vias with copper. Then, once the through-silicon vias are open through thinning of the silicon layer, the risks of electromigration of the copper atoms will be greater if the thickness of the barrier layer on the wall of vias is small, since the barrier function is less effective.

SUMMARY OF THE INVENTION

There is therefore a need to offer a new method of depositing a barrier layer based on nickel or cobalt that makes it possible to increase the amount of metal deposited at the bottom of the cavities that are intended to form through-silicon vias, but also on the walls of these cavities.

It would also be desirable to have compositions that make it possible to deposit metallic layers that have higher "step coverage", which is expressed as the ratio of the thickness of the layer at the bottom of the vias to the thickness of the surface layer.

The aim of the present invention is therefore to address the problems of depositing barrier layers on structures of the "through-silicon via" type, notably for making integrated circuits in three dimensions, by chemical means, preferably without electrical polarization of the substrate to be coated.

It was discovered—and this constitutes the basis of the present invention—that the aforementioned technical problem could be solved by means of very specific compositions, which are based on a metal salt of nickel or cobalt and a reducing agent. The compositions according to the invention are notably characterized in that they contain a polymer comprising amine functions.

DETAILED DESCRIPTION

It was discovered, against all expectations, that a polymer bearing amine functions promotes unconventional growth of nickel or cobalt on the substrate, by decreasing the growth rate of the metal at the top of the vias, so that it is possible for the first time to invert the degree of coverage of the surface of the vias between the top and the bottom of the cavity to be filled. The thickness of the barrier layer is also increased on the wall of the vias. Subsequent filling of the vias with copper by electrodeposition is thus facilitated, and as the barrier effect of the deposit increases with its thickness, the risks of leakage of current and malfunctioning of the electronic device that may arise therefrom are minimized.

Thus, according to a first aspect, the present invention relates to a method of electroless coating of an electrically conducting or semiconducting substrate, such as a silicon substrate, covered with a layer of an electrically insulating material, and having a collection of cavities (blind vias) notably intended to form through-silicon vias used for the fabrication of integrated circuits in three dimensions, said method consisting of coating the insulating surface of the cavities of said substrate with a metallic layer forming a barrier to the diffusion of copper comprising a material based on nickel or cobalt, characterized in that it comprises contacting said insulating surface with an aqueous solution comprising:

at least one metal salt of nickel or cobalt ions, preferably at a concentration between $10^{-3}$ M and 1 M;

at least one reducing agent of the nickel or cobalt ions, preferably in an amount between $10^{-4}$ M and 1 M;

optionally, at least one stabilizer of the nickel or cobalt ions, preferably in an amount between $10^{-3}$ M and 1 M;

at least one polymer bearing amine functions, preferably at a concentration in the range from 5 to 250 mg/l, and at a temperature between 50° C. and 90° C., preferably between 60° C. and 80° C., for a time between 30 s and 30 min, preferably between 2 min and 20 min, to form a metallic layer having a thickness of at least 6 nanometers at the bottom of the cavities.

It has been shown that this method makes it possible to deposit a metallic layer of nickel in a sufficient thickness at the bottom of cavities having high aspect ratios, notably of 7:1 and above, with a step coverage greater than 80%, or even greater than 100%, at a rate compatible with industrial production.

According to the method of the invention, the concentration of polymer bearing amine functions is advantageously selected in such a way that the step coverage of the deposited layer of nickel—being expressed as the ratio of the thickness of the layer at the bottom of the vias to the thickness of the surface layer—is greater than 80%, preferably greater than 90%, and more preferably greater than 100%. In one embodiment of the invention, it is even possible to obtain a step coverage greater than 110% or 120%.

It was in fact discovered that a polymer bearing amine functions makes it possible, in the presence of a nickel- or cobalt-stabilizing agent such as a nonpolymeric amine, to increase the step coverage of the nickel deposit in cavities having very high aspect ratios, typically greater than 7:1.

According to a second aspect, the present invention relates to a kit intended for coating an electrically conducting or semiconducting substrate, such as a silicon substrate, covered with a layer of an electrically insulating material, and having a collection of cavities (blind vias) notably intended to form through-silicon vias used for the fabrication of integrated circuits in three dimensions, characterized in that it comprises:

at least one metal salt of nickel or cobalt ions at a concentration between $10^{-3}$ M and 1 M;

at least one reducing agent of the nickel or cobalt ions in an amount between $10^{-4}$ M and 1 M;

optionally, at least one stabilizer of the nickel or cobalt ions, in an amount between $10^{-3}$ M and 1 M;

at least one polymer bearing amine functions at a concentration in the range from 5 to 250 mg/l, and the polymer and the reducing agent are packaged separately.

In this kit, the metal salt is for example nickel sulfate hexahydrate, and the reducing agent is preferably dimethylamine borane.

According to one embodiment, the polymer bearing amine functions is a poly(ethylene imine) of number-average molecular weight between 500 and 700 g/mol. The polymer bearing amine functions can be present at a concentration between 15 and 100 mg/l.

Excellent results were obtained using an aqueous solution comprising:

at least one metal salt of nickel at a concentration between 100 mM and 200 mM;

at least one reducing agent of boron in an amount between 400 mM and 550 mM;

optionally, at least one stabilizer, preferably citric acid in an amount between 150 mM and 300 mM;

a poly(ethylene imine) having a number-average molecular weight $M_n$ of about 600 g/mol, in an amount in the range from 15 to 100 mg/l, and optionally an agent for adjusting the pH to a value in the range from 8.5 to 9.5.

This solution is advantageously applied on a silicon substrate covered with an insulating layer of silicon dioxide or of poly-4-vinylpyridine (P4VP), the surface of said insulating layer optionally having been activated with a palladium compound. In this solution, the poly(ethylene imine) is preferably branched.

For the preferred applications of the invention, the solution contains at least one metal salt selected from the salts of nickel and of cobalt so as to deposit a layer comprising nickel or cobalt. The solution does not contain copper salts.

The barrier layer can also comprise an alloy of nickel or cobalt such as nickel-tungsten (NiW), cobalt-tungsten (CoW), nickel-cobalt or nickel-cobalt-tungsten. Tungsten can be supplied to the aforementioned alloys by adding tungstic acid $WO_2(OH)_2$ or a tungstate salt such as ammonium tungstate.

The salt of nickel or of cobalt is preferably a water-soluble salt selected from the group comprising acetate, acetylacetonate, hexafluorophosphate, nitrate, perchlorate, sulfate and tetrafluoroborate.

A metal salt that is preferred in the context of the present invention is selected from nickel sulfate or cobalt sulfate, nickel chloride or cobalt chloride, nickel acetate or cobalt acetate, or nickel sulfamate or cobalt sulfamate. For example nickel sulfate hexahydrate is selected.

The polymer comprising "amine" groups or functions in the sense of the present invention comprises several aliphatic or aromatic amine groups situated in the skeleton of the polymer and/or on a pendant chain, and said amine groups can be primary, secondary or tertiary. The majority of the amine groups preferably form part of a repeat unit of the polymer. The polymer is preferably in the neutral form (i.e. nonprotonated) and does not comprise a positively-charged quaternary amine function. Polymer means a compound preferably obtained by reaction of a starting compound with itself. The polymer bearing amine functions is preferably a polymer of at least one monomer bearing an amine function.

The "amine" polymer can be selected from the polymers and copolymers derived from chitosans, poly(allyl-amine)s, poly(vinyl-amine)s, poly(vinyl-pyridine)s, poly(amino-styrene)s, poly(ethylene imine)s, poly(L-lysine)s, and the acid (or protonated) forms of these polymers.

The poly(allyl-amine) polymers and copolymers will preferably have a number-average molecular weight $M_n$ between 500 and 60 000 g/mol, and comprise units having the following formula in which n represents an integer.

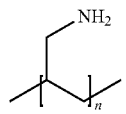

The poly(4-amino-styrene) polymers and copolymers can be in the leucoemeraldine and emeraldine forms, and will preferably have a number-average molecular weight $M_n$ between 500 and 150 000 g/mol. They comprise units having the following formula in which n represents an integer.

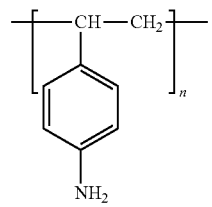

The poly(vinyl-amine)s can be selected from polymers and copolymers of vinyl-amine of formula $CH_2=CH-NH_2$ preferably having a number-average molecular weight $M_n$ between 500 and 25 000 g/mol. The poly(vinyl-amine)s can also be selected from polymers and copolymers of N-methyl-vinyl-amine $CH_2=CH-NHCH_3$ preferably having a number-average molecular weight $M_n$ between 500 and 500 000 g/mol.

The polymers and copolymers of poly(vinyl-pyridine), for example of poly(2-vinyl-pyridine) or of poly(4-vinyl-pyridine), preferably have a number-average molecular weight $M_n$ between 500 and 15 000 g/mol.

Finally the poly(L-lysine) will preferably be selected from polymers and copolymers of poly(L-lysine) having a weight-average molecular weight $M_n$ between 500 and 140 000 g/mol, which comprises units having the following formula in which n represents an integer.

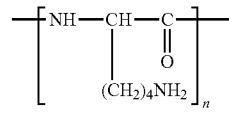

According to one embodiment of the invention, it is preferable to use a homopolymer or copolymer of poly(ethylene imine), which comprises nitrogen atoms in its skeleton, but also pendant groups when it is branched. The poly(ethylene imine) can be in its basic form, the amine functions not being protonated. It can alternatively be in the acid form, some or all of the amine functions that it bears being protonated.

The poly(ethylene imine) can be telechelic in the sense in which the polymer or copolymer of poly(ethylene imine) is linear and capable of undergoing further polymerization owing to the presence of reactive groups at each of the two ends of the chain.

For example, a linear poly(ethylene imine) will be selected with a number-average molecular weight $M_n$ between 500 and 25 000 g/mol, which comprises units having the following formula in which n represents an integer.

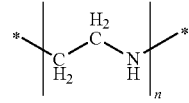

It is also possible to select a branched poly(ethylene imine) with number-average molecular weight $M_n$ between 500 and 70 000 g/mol which comprises primary amine, secondary amine and tertiary amine units in a certain ratio. A branched poly(ethylene imine) can be represented schematically by the following formula in which n represents an integer, although the formula does not correspond to the exact structure of the polymer.

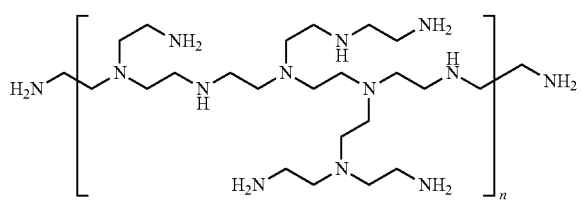

The poly(ethylene imine) can be a polyethylene imine of CAS number 25987-06-8, having for example a number-average molecular weight $M_n$ between 500 and 700 g/mol, and preferably a weight-average molecular weight $M_w$ between 700 and 900 g/mol. Such a poly(ethylene imine) exists under reference 408719, marketed by the company Sigma-Aldrich.

The poly(ethylene imine) can also be a poly(ethylene imine) of CAS number 9002-98-6, having for example a number-average molecular weight $M_n$ between 500 and 700 g/mol. Such a poly(ethylene imine) exists under reference 02371, sold by the company Polysciences, Inc.

For example, when the diameter of the opening of the cavities is between 1 and 10 microns, it is possible to use a poly(ethylene imine) of number-average molecular weight between 500 and 700 g/mol, at a concentration preferably between 15 and 100 mg/l.

The derivatives of chitosan (poly-D-glucosamine) can have a number-average molecular weight between 500 and 15 000 g/mol.

In the present application, the number-average molecular weight and weight-average molecular weight of the polymer can be measured independently of one another by a classical method known by a person skilled in the art, such as gel permeation chromatography (GPC) or light scattering (LS).

The concentration of polymer bearing amine functions used according to the present invention is advantageously from 5 to 250 mg/l, more particularly from 10 to 200 mg/l, more preferably from 15 to 150 mg/l, for example from 15 to 100 mg/l or better still from 20 to 100 mg/l (1 mg/l being equivalent to 1 ppm).

The minimum concentration of polymer bearing amine functions will advantageously be selected in such a way that a barrier layer is obtained whose step coverage is increased. Generally an increase in step coverage is observed that is proportional to the contact time and to the concentration of polymer bearing amine functions. It will be possible to estimate the value of each of the two variables beyond which a limit of the step coverage is obtained. The contact time will also be selected notably in relation to the desired thickness of the barrier layer at the bottom of the cavities.

Advantageously, the reducing agent can be selected from the group comprising phosphorus derivatives, borane derivatives, glucose, formaldehyde and hydrazine.

The phosphorus derivatives can be selected from hypophosphorous acid ($H_3PO_2$) and salts thereof, and boric acid and salts thereof.

The reducing agent used is advantageously selected from boron derivatives and in particular from dimethylamine borane, pyridine borane, morpholene borane or tert-butylamine borane. Preferably, dimethylamine borane (DMAB) will be used.

The stabilizer can be selected from compounds that can form complexes with nickel ions or cobalt ions, so as to avoid reduction of the metal ions in solution by the reducing agent.

The stabilizer of the metal ions can be selected from the group comprising ethylenediamine and the salts of acetic, succinic, malonic, aminoacetic, malic or citric acids. Preferably citric acid or a salt thereof is selected for stabilizing the $Ni^{2+}$ ions.

The pH of the aqueous solution can be acid or basic, and can be adjusted in the desired range of pH by means of one or more pH modifying compounds (or buffers) such as those described in "Handbook of Chemistry and Physics—84$^{th}$ Edition" by David R. Lide published by CRC Press.

The aqueous solution can for example comprise an agent for adjusting the pH to a value between 3 and 12, for example a nonpolymeric amine for adjusting the pH between 8 and 12.

When the polymer bearing amine functions is a poly(ethylene imine), the pH of the aqueous solution according to the invention is advantageously from 8.5 to 10. It is notably of the order of 9, for example between 8.9 and 9.1. In this case, it is possible to use tetramethylammonium hydroxide (TMAH) or N-methyl-ethanolamine as agent for adjusting the pH.

According to one embodiment, the pH of the solution is selected so that all the amine functions of the polymer are not protonated or so that some of the amine functions of the polymer are protonated.

In general, the metallic layer can be produced by dipping the substrate in the aqueous solution defined above, at a temperature between 50 and 90° C., preferably at 70° C., for a time from 30 s to 30 min, depending on the desired layer thickness.

A preliminary step of prewetting of the substrate can be carried out before exposing the substrate to the aqueous solution according to the invention. The substrate is for example immersed in an aqueous solution or a solution containing the metal salt with its stabilizer, but without a reducing agent. Deionized water is preferably used. The whole is submitted to a negative pressure below 500 mbar for 1 to 30 min, preferably for 5 to 15 min.

According to an advantageous embodiment, this layer can be annealed at a temperature between 200 and 400° C., preferably at 250° C., for a time between 1 min and 30 min, preferably about 10 min, under inert or reducing atmosphere.

The step of depositing the layer of nickel or of cobalt can be carried out by rotating the substrate to be coated at a speed between 20 and 600 revolutions per minute, or by applying simple recirculation of the aqueous solution in the reactor.

With the aqueous solution described above, used in the aforementioned general temperature range, a metal film was obtained having a thickness between 6 and 200 nanometers for a contact time between 1 min and 20 min.

The aspect ratio—expressed as the ratio of the depth to the diameter of the opening of the cavities—can vary from 2:1 to 30:1. The method according to the invention advantageously makes it possible to deposit a metallic layer of nickel in cavities having particularly high aspect ratios, for example greater than 2:1, greater than 3:1, greater than 4:1, greater than 5:1, greater than 6:1, even greater than 7:1 or more, increasing its step coverage.

For cavities whose aspect ratio is of the order of 10:1, we can for the first time obtain a step coverage greater than 80%, or even greater than 85%, whereas the step coverage obtained with the methods of the prior art does not exceed 80%. The applicant has even observed, quite unexpectedly, that it is even possible to invert the step coverage and exceed a value of 100%.

The method according to the invention also makes it possible to increase the step coverage of a barrier layer based on nickel on the surface of cavities having very high aspect ratios, notably greater than 20:1 and that can even reach 30:1.

The depth of the cavities varies depending on the position and the function of the through-silicon via that is to be formed in the silicon wafer. Thus, it can vary from 1 to 500 microns, typically from 10 to 250 microns. The cavities have for example a diameter at their opening in the range from 200 nm to 200 microns, generally in the range from 1 to 75 microns.

According to one embodiment of the invention, the opening of the cavities is from 1 to 10 microns whereas their depth is from 10 to 50 microns.

The insulating substrate on which the barrier layer is deposited can consist of a material selected from silica $SiO_2$ and its derivatives such as SiOC, SiN, SiOCH and SiC, and said material can be deposited by a vapor phase process (CVD, Chemical Vapor Deposition) or by thermal oxidation.

The insulating substrate can alternatively consist of an insulating polymer deposited by spin coating or by electrografting, for example by an electrografting process according to the teaching of application FR 2 933 425-A1.

The polymer can be selected from polymers having one or more groups selected from the group consisting of primary amine, secondary amine, enamine, alcohol, thiol, aromatic heterocyclic (such as in particular pyridine, pyrrole, thiophene) and nonaromatic heterocyclic groups. For example, a polymer of vinyl-pyridine will be used, such as poly(4-vinyl-pyridine) (P4VP) or a methacrylate polymer such as poly-2-hydroxyethyl methacrylate (PHEMA).

The surface of the insulating layer can be activated prior to deposition of the barrier layer based on nickel or cobalt. The surface activation can be performed for example by grafting a noble metal such as palladium according to the teaching of documents FR 2 950 063-A1 or FR 2 950 634-A1.

The surface of an insulating substrate having a polymer can be activated with palladium, with a view to subsequent covering by the metallic barrier layer. The composition used for carrying out this activation contains for example an activator consisting of one or more complexes of palladium and a binder having at least two glycidyl functions and at least two isocyanate functions in a solvent. The palladium complex can bear diethylenetriamine ligands, and the binder can advantageously be diglycidyl ether butane.

The surface of an insulating substrate having a silicon oxide can be activated in the same way with a palladium complex such as a palladium complex with diethylenetriamine, using aminopropyltrimethoxysilane as bifunctional organic binder.

The activation of the surface of the insulating layer can also be carried out by deposition of nickel-boron nanoparticles such as described in document WO 2010/001054.

In the context of the preferred applications of the invention, the method that has just been described will be followed by a step of filling of the cavities with copper, optionally preceded by a step of formation of a copper seed layer.

It has been observed that it is possible, by means of the solutions and the method according to the invention, to obtain filling with copper by electrodeposition of excellent quality in cavities having very high aspect ratios and whose surface is formed from a layer of an insulating material.

The vias covered with a barrier layer comprising nickel or cobalt according to the method described above can then be filled with copper by a conventional method of electrodeposition used for filling through-silicon vias. These methods that are well known by a person skilled in the art comprise the application of a current to the wafer covered beforehand with the insulating layer, the barrier layer, optionally with a copper seed layer, and dipped in an acid or basic bath of copper ions.

During the filling step, the surface of the cavity to be filled is polarized either in galvanostatic mode (fixed imposed current), or in potentiostatic mode (potential imposed and fixed, optionally relative to a reference electrode), or in pulsed mode (in current or in voltage).

The surface of the cavity to be filled is for example polarized in continuous mode by imposing a current per unit of area in a range from 0.2 $mA/cm^2$ to 50 $mA/cm^2$, preferably from 0.5 $mA/cm^2$ to 5 $mA/cm^2$.

The deposition of the barrier layer of the invention advantageously makes it possible to omit a step of deposition of a copper seed layer that is generally necessary to permit filling of the vias with copper without causing the formation of cracks or voids in the copper mass.

According to one embodiment, the method according to the invention therefore comprises a step following the step of formation of the barrier layer, which consists of filling the cavities with copper without having previously formed a copper seed layer on the surface of the barrier layer.

The cavities can be filled with copper by electrodeposition. In this embodiment, the electrodeposition bath can comprise, in solution in a solvent:
  copper ions at a concentration between 45 and 1500 mM;
  a copper complexing agent consisting of at least one compound selected from aliphatic polyamines having 2 to 4 amino groups at a concentration between 45 and 3000 mM;
  the molar ratio between the copper and said complexing agent being between 0.1 and 5; and
  optionally an accelerator such as for example thiodiglycolic acid at a concentration between 1 and 500 mg/l.

According to a particular feature, the copper ions are present in the electrodeposition composition at a concentration between 45 and 500 mM, preferably between 100 and 300 mM.

Among the aliphatic polyamines that can be used, we may mention ethylenediamine, diethylenediamine, triethylenetetramine and dipropylenetriamine and preferably ethylenediamine.

The concentration of complexing agent in the electrodeposition composition is generally between 45 and 1500 mM, preferably between 300 and 900 mM. The molar ratio of copper to complexing agent is generally between 0.1 and 5, preferably between 0.1 and 1 and more preferably between 0.2 and 0.4.

In the electrodeposition composition, ethylenediamine constitutes a compound that is particularly preferred as complexing agent and excellent results were obtained using compositions in which this compound is present at a concentration between 300 and 900 mM, in particular when the molar ratio between copper ions and ethylenediamine is between 0.2 and 0.4.

Advantageously, the pH of the electrodeposition composition will be between 7 and 11, preferably between 8 and 9.5. A pH adjusting agent can be added.

Filling of the cavities with copper can be carried out at a temperature between 20 and 30° C., i.e. at room temperature.

According to a third aspect, the present invention relates to the use of an aqueous solution or of a kit as defined above for coating an electrically conducting or semiconducting substrate, such as a silicon substrate, covered with a layer of an electrically insulating material, and having a collection of cavities notably intended to form through-silicon vias used for the fabrication of integrated circuits in three dimensions. The aqueous solution or kit is preferably used prior to filling of the cavities with copper.

The present invention is illustrated by the following non-limiting examples, in which the aqueous solutions according to the invention are used for depositing a copper diffusion barrier layer comprising nickel and boron. These examples notably find application in the fabrication of copper interconnecting structures for integrated circuits.

In these examples, and unless stated otherwise, the temperature is room temperature (20 to 30° C.).

EXAMPLE 1

Reference

In this example, electroless deposition of a copper diffusion barrier layer was effected from a solution containing a nickel salt, a stabilizer, and a chemical reducing agent according to the teaching of document FR 2 950 863-A1.

The barrier layer was deposited on a substrate having cylindrical cavities of variable size and coated with an insulating layer of poly-4-vinylpyridine.

a) Preparation of a Silicon-Based Substrate Having Cylindrical Cavities and Having a Surface Formed from a Polymer of 4-Vinylpyridine:

a1) Substrate:

In this example the substrate used was a piece of P doped silicon with side of 4 cm (4×4 cm) and thickness of 750 μm having a resistivity of 20 Ω·cm. This substrate had through-silicon vias with diameter of 3, 4 and 5 μm and depth of 27, 32 and 35 μm respectively.

a2) Deposition of a Layer of Poly-4-Vinylpyridine (P4VP) on the Substrate Surface by Electrografting:

Electrografting Solution

The electrografting solution employed in this example was an aqueous solution prepared by adding 5 ml of 4-vinylpyridine (4-VP; $4.5 \cdot 10^{-2}$ mol) to 95 ml of 1M HCl, then adding to the resultant mixture 236 mg of 4-nitrobenzene diazonium tetrafluoroborate ($DNO_2$; $1 \cdot 10^{-3}$ mol).

Protocol:

Electrografting on the silicon substrate was carried out using a system comprising:
- a specimen holder equipped with means for rotating at a predetermined speed and arranged for supporting the substrate, the assembly thus constituted being intended to serve as working electrode;
- a leaf of carbon or of platinum intended to serve as counterelectrode;
- a stabilized electric power supply and a device for making electrical contact;
- a light source (halogen lamp, 150 W) placed in front of the substrate and equipped with filter(s), so as to obtain a luminous intensity on the substrate surface between 2000 and 6000 lux (4000 lux in this case). For this purpose, the lamp was placed at a distance of about 10 cm from the surface of the specimen. The substrate was illuminated throughout the experiment.

The electrografting of P4VP on the surface of the silicon substrate was performed by applying to the substrate, previously set in rotation at a speed from 10 to 200 rev·min$^{-1}$ (50 rev·min$^{-1}$ in the example), a "voltage-pulsed" electrochemical protocol for a predetermined time of the order of 4 to 30 minutes (10 minutes in the example).

The electrochemical protocol used comprises:
- a total cycle of 0.11 s;
- a polarization time $T_{on}$ of 0.02 s during which a cathodic potential difference of −15 V is applied; and
- a rest time at zero potential $T_{off}$ lasting 0.09 s.

In the aforementioned conditions, a layer of polymer (P4VP) was obtained having a thickness of 200 nanometers.

Once electrografting was completed, the polymer-coated substrate was rinsed several times with water and then with dimethylformamide (DMF) before being dried under a stream of nitrogen.

b) Activation of the Substrate Surface:

b1) Preparation of the Palladium Complex:

A 250-ml single-necked flask was charged with 802 mg (4.52 mmol) of palladium chloride $PdCl_2$, 50 ml of deionized water and 1 ml of concentrated hydrochloric acid (37%, d=1.17), i.e. a concentration of acid of 0.2 M. The mixture was heated at 60° C. for 20 minutes to dissolve the palladium chloride and thus obtain a reddish-brown solution of $H_2PdCl_4$.

0.500 ml (4.58 mmol) of diethylenetriamine was added to the solution thus obtained. This addition caused a color change of the solution from reddish-brown to orangey yellow.

The reaction mixture was kept at 60° C. for a further 2 h.

The solvent was evaporated in a rotary evaporator. The solid that remained was recrystallized from hot ethanol, obtaining 1.268 g of a palladium complex of formula $C_4H_{13}N_3PdCl_2$ in the form of yellowish needles (yield=88%). $^1$H NMR ($D_2O$): 2.62 (ddd, 2H); 2.82-2.94 (m, 4H); 3.02 (td, 2H).

b2) Preparation of the Activation Solution:

8 mg of the complex obtained at the end of step b1) was dissolved in 10 ml of N-methylpyrrolidinone (NMP).

A clean, dry beaker was charged with 50 ml of diethylene glycol monoethyl ether, 10 ml of the aforementioned solution of NMP containing the palladium complex and 0.345 ml of diglycidyl ether butane. The whole was mixed by stirring.

b3) Treatment of the Substrate Surface:

The mixture obtained at the end of the aforementioned step b2) was brought to about 65° C. and the substrate prepared in step a) described above was immersed therein for about 10 minutes. The substrate thus treated was then rinsed with copious amounts of deionized water and dried under a stream of nitrogen.

c) Deposition of a Metallic Layer of NiB c1) Extemporaneous Preparation of the Solution:

A 1-liter vessel was charged successively with 31.11 g of nickel sulfate hexahydrate (0.118 mol), 44.67 g of citric acid (0.232 mol) and 58 g of N-methyl-ethanolamine (0.772 mol). The final pH was adjusted to 9 (±0.1) with the base and the total volume was adjusted to 1 liter with distilled water. The solution was stabilized with 0.111 g of thiodiglycolic acid (0.739 mmol).

One volume of a reducing solution comprising 28 g/l of dimethylamine borane (DMAB; 0.475 mol) was added to nine volumes of the aforementioned solution, just before it was used in the next step.

c2) Formation of a Metallic Layer of NiB Intended to Form a Diffusion Barrier:

A metallic layer of NiB was produced on the "activated" surface of the substrate obtained at the end of step b) by dipping in the solution prepared previously and heated at 70° C., for a time between 30 seconds and 20 minutes, depending on the desired thickness. In this example, the dipping time was 5 min to obtain a thickness of the metallic layer of about 50 nm and 8 min for a thickness of the metallic layer of 90 nm.

The metallic layer thus obtained was annealed at 250° C. for 10 minutes under a reducing atmosphere ($N_2+H_2$ mixture (5% $H_2$)).

Characterization of the Treated Substrate:

The coated substrate obtained at the end of steps a) to c) described above was characterized by scanning electron microscopy (SEM). Table 1 gives the thicknesses measured at the substrate surface and at the bottom of the cavities for establishing the reference thicknesses without addition of amine polymer.

EXAMPLE 2

In this example, electroless deposition of a copper diffusion barrier layer was carried out starting from a solution containing a nickel salt, a stabilizer, a chemical reducing agent and an amine polymer according to the invention.

The substrate was identical to that used for example 1. Deposition of the layer of P4VP (step a) and activation of the substrate surface (step b) were carried out in the same conditions as in example 1.

c) Electroless Deposition of a Metallic Layer of NiB c1) Extemporaneous Preparation of the Electroless Solution:

An amount between 10 and 20 ppm (mg/l) of polyethylene imine (PEI) of reference 408719 sold by the company Sigma-Aldrich was added to the solution prepared in step c) of example 1.

c2) Formation of a Metallic Layer of NiB Intended to Form a Diffusion Barrier:

A metallic layer of NiB was produced on the "activated" surface of the substrate obtained at the end of step b) by dipping in the electroless solution prepared previously and heated at 70° C., for a time between 30 seconds and 20 minutes, depending on the desired thickness. In this example, the dipping time was 12 min to obtain a thickness of the metallic layer of about 40 nm and 22 min to obtain a layer of 80 nm.

The metallic layer thus obtained was annealed at 250° C. for 10 minutes under a reducing atmosphere ($N_2+H_2$ mixture (5% $H_2$)).

Characterization of the Treated Substrate:

The coated substrate obtained at the end of steps a) to c) described above was characterized by scanning electron microscopy (SEM).

The following table gives the thicknesses measured at the surface of the substrate and at the bottom of the cavities to evaluate the effect of PEI on control of the step coverage in deposition of the nickel-boron layer formed.

TABLE 1

Thicknesses of a layer of NiB measured at the top and at the bottom of the cavities with the solution of the present invention and the reference solution, for deposition at the top of the cavities of the order of 40 to 50 nm

| Specimen | PEI (mg/l) | time (min) | Size of the vias (μm * μm) | Top (nm) | Bottom (nm) | Coverage (%) |
|---|---|---|---|---|---|---|
| Ref. 1 | 0 | 5 | 5 * 35 | 48 | 36 | 75 |
| Spec. 1a | 10 | 12 | 5 * 35 | 46 | 41 | 89 |
| Spec. 1b | 20 | 12 | 5 * 35 | 40 | 52 | 130 |
| Ref. 2 | 0 | 5 | 4 * 32 | 50 | 38 | 76 |
| Spec. 2a | 10 | 12 | 4 * 32 | 45 | 39 | 87 |
| Spec. 2b | 20 | 12 | 4 * 32 | 38 | 38 | 100 |
| Ref. 3 | 0 | 5 | 3 * 27 | 48 | 38 | 79 |
| Spec. 3a | 10 | 12 | 3 * 27 | 48 | 40 | 83 |
| Spec. 3b | 20 | 12 | 3 * 27 | 36 | 40 | 111 |

TABLE 2

Thicknesses of a layer of NiB measured at the top and at the bottom of the cavities with the solution of the present invention and the reference solution, for deposition at the top of the cavities of the order of 70 to 90 nm

| Specimen | PEI (mg/l) | time (min) | Size of the vias (μm * μm) | Top (nm) | Bottom (nm) | Coverage (%) |
|---|---|---|---|---|---|---|
| Ref. 4 | 0 | 8 | 5 * 35 | 92 | 66 | 72 |
| Spec. 4a | 10 | 22 | 5 * 35 | 82 | 72 | 88 |
| Spec. 4b | 20 | 22 | 5 * 35 | 74 | 85 | 114 |
| Ref. 5 | 0 | 8 | 4 * 32 | 88 | 68 | 77 |
| Spec. 5a | 10 | 22 | 4 * 32 | 80 | 68 | 85 |
| Spec. 5b | 20 | 22 | 4 * 32 | 70 | 84 | 120 |
| Ref. 6 | 0 | 8 | 3 * 27 | 90 | 68 | 76 |
| Spec. 6a | 10 | 22 | 3 * 27 | 78 | 67 | 86 |
| Spec. 6b | 20 | 22 | 3 * 27 | 71 | 82 | 115 |

It can be seen that the use of a polymer bearing amine functions such as poly(ethylene imine) makes it possible, at constant thickness at the top of the via, to increase the thickness of the barrier layer at the bottom of the via. At a content of 20 mg/l, it is even possible to invert the step coverage beyond 100%.

The invention claimed is:

1. A method of electroless coating of a silicon substrate, covered with a layer of an electrically insulating material, and having a collection of cavities suitable for forming through-vias useful for the fabrication of integrated circuits in three dimensions, said method comprising coating the insulating surface of said cavities with a metallic layer that forms a barrier to the diffusion of copper and comprises a material based on nickel or cobalt,
wherein the method comprises contacting the insulating surface of said cavities with an aqueous solution comprising:
at least one metal salt of nickel or cobalt ions, at a concentration between $10^{-3}$ M and 1 M;
at least one reducing agent of the nickel or cobalt ions, at a concentration between $10^{-4}$ M and 1 M;
optionally, at least one stabilizer of the nickel or cobalt ions; and
at least one polymer bearing amine functions, at a concentration in the range from 5 to 250 mg/l,
at a temperature between 50° C. and 90° C., for a time between 30 s and 30 min, to form a metallic layer having a thickness of at least 6 nanometers at the bottom of the cavities, and
subsequent to the step of formation of the barrier layer, filling the cavities with copper without having first formed a copper seed layer on the surface of the barrier layer.

2. The method according to claim 1, wherein the metal salt is selected from the group consisting of nickel sulphate, cobalt sulfate, nickel chloride, cobalt chloride, nickel acetate, cobalt acetate, nickel sulfamate and cobalt sulfamate.

3. The method of claim 1, wherein the reducing agent is selected from the group consisting of phosphorus derivatives, borane derivatives, glucose, formaldehyde and hydrazine.

4. The method according to claim 1, wherein the polymer bearing amine functions is selected from the group consisting of polymers and copolymers derived from chitosans, poly(allyl-amine)s, poly(vinyl-amine)s, poly(vinyl-pyridine)s, poly(amino-styrene)s, poly(ethylene imine)s, poly(L-lysine)s, and acid forms of these polymers.

5. The method according to claim 1, wherein the stabilizer is selected from the group consisting of ethylenediamine, salts of acetic acid, salts of succinic acid, salts of malonic acid, salts of aminoacetic acid, salts of malic acid and salts of citric acid.

6. The method according to claim 1, wherein the insulating layer comprises a compound selected from the group consisting of $SiO_2$, SiOC, SiN, SiOCH, SiC, and an insulating polymer having one or more groups selected from the group consisting of primary amine, secondary amine, enamine, alcohol, thiol, aromatic heterocyclic and nonaromatic heterocyclic groups.

7. The method of claim 6, wherein the insulating layer polymer is present and has one or more groups selected from the group consisting of pyridine, pyrrole, and thiophene.

8. The method according to claim 1, wherein the aqueous solution further comprises an agent for adjusting the pH from 8 to 12.

9. The method according to claim 1, further comprising a step of activating the surface of the insulating layer with a palladium compound prior to deposition of the layer based on nickel or cobalt.

10. The method according to claim 1, wherein the cavities have a diameter at their opening in the range from 1 to 75 microns, and an aspect ratio in the range from 2:1 to 30:1.

11. The method according to claim 1, wherein the cavities are filled with copper by electrodeposition, and the electrodeposition bath comprises, in solution in a solvent:
    copper ions at a concentration between 45 and 1500 mM;
    a copper complexing agent consisting of at least one compound selected from aliphatic polyamines having 2 to 4 amino groups at a concentration between 45 and 3000 mM;
    the molar ratio between the copper and said complexing agent being between 0.1 and 5; and
    optionally an accelerator.

12. The method of claim 11, wherein thiodiglycolic acid is the accelerator, at a concentration between 1 and 500 mg/l.

13. The method of claim 1, wherein the stabilizer is present and the concentration of the stabilizer is in the range from $10^{-3}$ M to 1 M.

14. The method of claim 1, wherein the temperature is from 60° C. to 80° C.

15. The method of claim 1, wherein the time is from 2 to 20 min.

16. The method of claim 1, wherein the polymer bearing amine functions increases the deposition of nickel or cobalt at the bottom of the cavities relative to a case where the polymer bearing amine functions is not present.

17. A method of electroless coating of a silicon substrate, covered with a layer of an electrically insulating material, and having a collection of cavities suitable for forming through-vias useful for the fabrication of integrated circuits in three dimensions, said method comprising coating the insulating surface of said cavities with a metallic layer that forms a barrier to the diffusion of copper and comprises a material based on nickel or cobalt,
    wherein the method comprises contacting the insulating surface of said cavities with an aqueous solution comprising:
        at least one metal salt of nickel or cobalt ions, at a concentration between $10^{-3}$ M and 1 M;
        at least one reducing agent of the nickel or cobalt ions, at a concentration between $10^{-4}$ M and 1 M;
        optionally, at least one stabilizer of the nickel or cobalt ions; and
        at least one polymer bearing amine functions, at a concentration in the range from 5 to 250 mg/l,
    at a temperature between 50° C. and 90° C., for a time between 30 s and 30 min, to form a metallic layer having a thickness of at least 6 nanometers at the bottom of the cavities, and
    wherein the metallic layer is formed from the bottom to the top of the cavities, and the thickness of the metallic layer at the bottom of the cavities is at least 80% of the thickness at the top of the cavities.

18. A kit intended for coating an electrically conducting or semiconducting substrate, covered with a layer of an electrically insulating material, and having a collection of cavities suitable for forming through-vias useful for the fabrication of integrated circuits in three dimensions,
    wherein the kit comprises:
    at least one metal salt of nickel or cobalt ions at a concentration between $10^{-3}$ M and 1 M;
    at least one reducing agent of the nickel or cobalt ions in an amount between $10^{-4}$ M and 1 M;
    optionally, at least one stabilizer of the nickel or cobalt ions, in an amount between $10^{-3}$ M and 1 M;
    at least one polymer bearing amine functions at a concentration in the range from 5 to 250 mg/l, and
the polymer and the reducing agent being packaged separately, and
    the metal salt is nickel sulfate hexahydrate, and the reducing agent is dimethylamine borane.

19. The kit according to claim 18, wherein the polymer bearing amine functions is a poly(ethylene imine) of number-average molecular weight between 500 and 700 g/mol.

20. The kit according to claim 18, wherein the polymer bearing amine functions is present at a concentration between 15 and 100 mg/l.

* * * * *